(12) United States Patent
Harnishfeger et al.

(10) Patent No.: US 6,774,732 B1
(45) Date of Patent: Aug. 10, 2004

(54) SYSTEM AND METHOD FOR COARSE TUNING A PHASE LOCKED LOOP (PLL) SYNTHESIZER USING 2-PI SLIP DETECTION

(75) Inventors: David B. Harnishfeger, Chandler, AZ (US); Daniel E. Brueske, Fort Lauderdale, FL (US); Frederick L. Martin, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/367,007

(22) Filed: Feb. 14, 2003

(51) Int. Cl.[7] .......................... H03L 7/085; H03L 7/089; H03L 7/099; H03L 7/10; H03L 7/16
(52) U.S. Cl. ........................... 331/25; 331/1 A; 331/10; 331/14; 331/16
(58) Field of Search ............................ 331/1 A, 10–12, 331/14, 16–18, 25, DIG. 2; 327/156–159; 332/127; 360/51; 375/376; 455/260

(56) References Cited

U.S. PATENT DOCUMENTS

| | | | |
|---|---|---|---|
| 5,389,898 A | | 2/1995 | Taketoshi et al. |
| 5,686,864 A | | 11/1997 | Martin et al. |
| 5,736,904 A | | 4/1998 | Humphreys et al. |
| 5,783,972 A | * | 7/1998 | Nishikawa .................... 331/17 |
| 6,256,362 B1 | * | 7/2001 | Goldman ..................... 375/373 |
| 6,313,707 B1 | * | 11/2001 | Fischer et al. ................ 331/17 |

* cited by examiner

Primary Examiner—David Mis
(74) Attorney, Agent, or Firm—Miller, Johnson, Snell & Cummiskey, P.L.C.

(57) ABSTRACT

A system for coarsely tuning at least one voltage controlled oscillator (VCO) (211) in a phase locked loop (PLL) synthesizer (200) that includes a phase-frequency detector (PFD) for determining a phase difference between a VCO frequency and a reference frequency and providing an error signal if the VCO frequency and reference frequency are at least $2\pi$ radians out of phase. A monitor (215) is then used for tracking the number of error signals produced by the PFD. The free running frequency of the VCO may be coarsely tuned in the event the monitor circuit reaches some predetermined level. The invention offers great advantage in enabling a PLL to be coarsely tuned to enable the PLL's VCO to remain with an operational range despite operational factors that effect circuit operation.

20 Claims, 2 Drawing Sheets

100
—PRIOR ART—

SYSTEM AND METHOD FOR COARSE TUNING A PHASE LOCKED LOOP (PLL) SYNTHESIZER USING 2-PI SLIP DETECTION

TECHNICAL FIELD

This invention relates in general to phase locked loops (PLL) and more particularly to the tuning of a voltage controlled oscillator (VCO) to stay within the operational range of a PLL synthesizer.

BACKGROUND

The use of a voltage controlled oscillator (VCO) in phased locked loop (PLL) designs are well known in the art and are used in many different types of radio frequency (RF) industrial and consumer electronic circuit applications. Typically a PLL is used to control the VCO in order to provide a highly stable source of RF energy preferably with low current drain. One problem associated in using a voltage controlled oscillator (VCO) is that there are many different types of factors that work to change and/or vary the oscillators center frequency of operation. These factors include variations in VCO components, power supply restrictions that limit the dynamic range of the PLL and a need to lower the VCO frequency gain limiting PLL range. Many environmental conditions also contribute vary center frequency such as wide swings in ambient temperature. Often these deviations in center frequency can be extreme to the extent that the PLL will no longer operate due to this frequency deviation and the PLL's design limitations.

In addition, modern wireless networked devices require low cost implementations and demand quick methods to tune the range of the integrated VCO. These methods are often required to be as simple as possible to reduce the cost of implementing the integrated VCO in a device. The time required to "tune" is important to reduce power dissipation and overall current drain in the device. The longer the device has to be in the "operational" state the greater the average current drain. In a wireless network such as that defined by the Institute of Electrical and Electronics Engineers IEEE 802.15.4 WPAN standard, low power consumption is crucial. Hence, any modern VCO tuning method for wireless networked devices should be low in complexity with rapid speed in tuning.

FIG. 1 illustrates a prior art circuit diagram of a commonly used phase-frequency detector (PFD) circuit 100. Although there are many alternative PFD circuit designs, a configuration that includes two flip-flops and an AND gate is the most common and depicted here by way of example. The PFD 100 utilizes a plurality of flip-flops (101, 103, 105, 107) to compare the phase of a first input 111 and a second input 113. The PFD 100 then determines whether the operational frequency of input signals needs to be increased or decreased to match the phase of these input signals. This information is output at the up output 115 and output 117.

As is well known in the art, PFD 100 offers some unique benefits if the signals input to input 111 and input 113 are substantially distinct in frequency and phase. If the signals that are directed to input 111 and input 113 are greater than 360 degrees (2-pi or 2π radians) out of phase, then PFD 100 offers the ability to provide a phase slip. As known in the art, a "phase slip" is the ability to detect a required amount of frequency correction that should be applied to keep the two input signals in-phase. Flip flop 105 and flip flop 107 as well as the OR gate 119 provide an ability to measure this phase slip.

Hence, PFD 100 provides the ability to determine whether there are two "UP" frequency corrections before there is a "DOWN" frequency correction or alternatively whether there are two "DOWN" frequency corrections before there is an "UP" frequency correction. When this occurs PFD 100 can determine with certainty that the signals provided to the inputs 111, 113 are more than 360 degrees out of phase. If the two input signals are too low in frequency, there will be a high pulse on the UP-SLIP output 121. Conversely if the two input signals are too high in frequency, there will be a high pulse generated on the DOWN-SLIP output 123. The OR gate 119 is used to remove the pulse once it is provided to either the UP-SLIP output 121 or DOWN-SLIP output 123. As will be evident to those skilled in the art, PFD 100 is used to provide a direction upon which to make a frequency correction. U.S. Pat. No. 4,764,737 assigned to Motorola, Inc. describes this invention in detail and is herein incorporated by reference.

Prior art techniques for tuning a VCO have used a "closed loop" operation of the PLL to extract information in order to make decisions on the VCO's range of operation. For example, U.S. Pat. No. 5,686,864 assigned to Motorola, Inc. entitled "Method and Apparatus for Controlling a Voltage Controlled Oscillator Tuning Range in a frequency Synthesizer" determines shift based on the control voltage level of the VCO. One disadvantage of using this type of technique is the closed loop operation range of the control VCO control voltage range will be limited by the levels set by the "lock detect" circuitry. Still another disadvantage are large time constants involved with making this determination. Since the PLL operates closed loop, the time constants can be very large. This has the effect of limiting the minimum time to "tune" the VCO.

Further, there are additional patents that use a closed loop operation to tune the range of the VCO. U.S. Pat. No. 5,736,904 assigned to Motorola, Inc. entitled "Automatic trimming of a controlled Oscillator in a Phase Locked Loop," and herein incorporated by reference illustrates this type of tuning operation. This type of technique increases system complexity by incorporating analog-to-digital converters (A/Ds) and digital-t-analog converters (D/As) as a method to store tuning values. U.S. Pat. No. 5,389,898 also assigned to Motorola, Inc. entitled "Phase Locked Loop having plural Selectable Voltage Controlled Oscillators" also operates with the PLL in a closed loop operation. These types of systems require that the VCOs have a non-overlapping range.

Thus, the need exists to provide a PLL synthesizer and method that places less restriction on the VCOs overlapping range. The PLL synthesizer should be low cost, fast acting that should enable the free running frequency of a VCO to be coarsely tuned to stay within a predetermined range.

SUMMARY OF THE INVENTION

Briefly, according to the invention, there is provided a system and method for coarse tuning the voltage controlled oscillator (VCO) in a phase locked loop (PLL) synthesizer. During a coarse tune mode, the voltage on the VCO input is forced to a predetermined nominal value by removing the charge pump from the PLL circuit and setting a desirable target bias for the VCO free running frequency. The circuit topology of the present invention uses a loop filter driven by the same voltage reference that also drives the input to the VCO. This has the effect of minimizing transients and settling the frequency of operation when the PLL switches from a "coarse tune" mode to normal closed loop tracking mode. The output of the VCO is compared to the reference frequency after a pre-determined frequency division. The phase detector is designed to output pulses whenever a $2\pi$ slip occurs between the reference frequency and the divided down VCO. The $2\pi$ slip pulses are used by a monitor and control circuit to estimate the error in the VCO's operating center frequency. The invention provides several methods by which to monitor and control is frequency. The output of the monitor and control circuit can then be used to control a second port in the VCO that acts to coarse tune the VCO without affecting its tune sensitivity. The present invention offers a distinct advantage in that the coarse tuning system does not require the closed loop operation of the PLL. Thus, the PLL quickly arrives at a final frequency adjustment solution, and can be used with VCOs that have overlapping and non-monotonic tune ranges.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
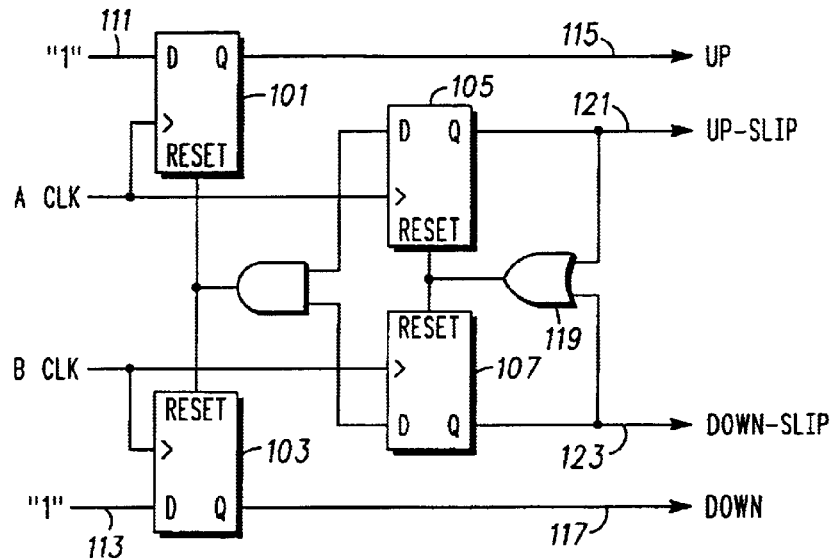
FIG. 1 is a prior art circuit diagram illustrating a common phase-frequency detector (PFD) circuit showing implementation of a typical $2\pi$ slip detector.

While the specification concludes with claims defining the features of the invention that are regarded as novel, it is believed that the invention will be better understood from a consideration of the following description in conjunction with the drawing figures, in which like reference numerals are carried forward.

Figure 2:
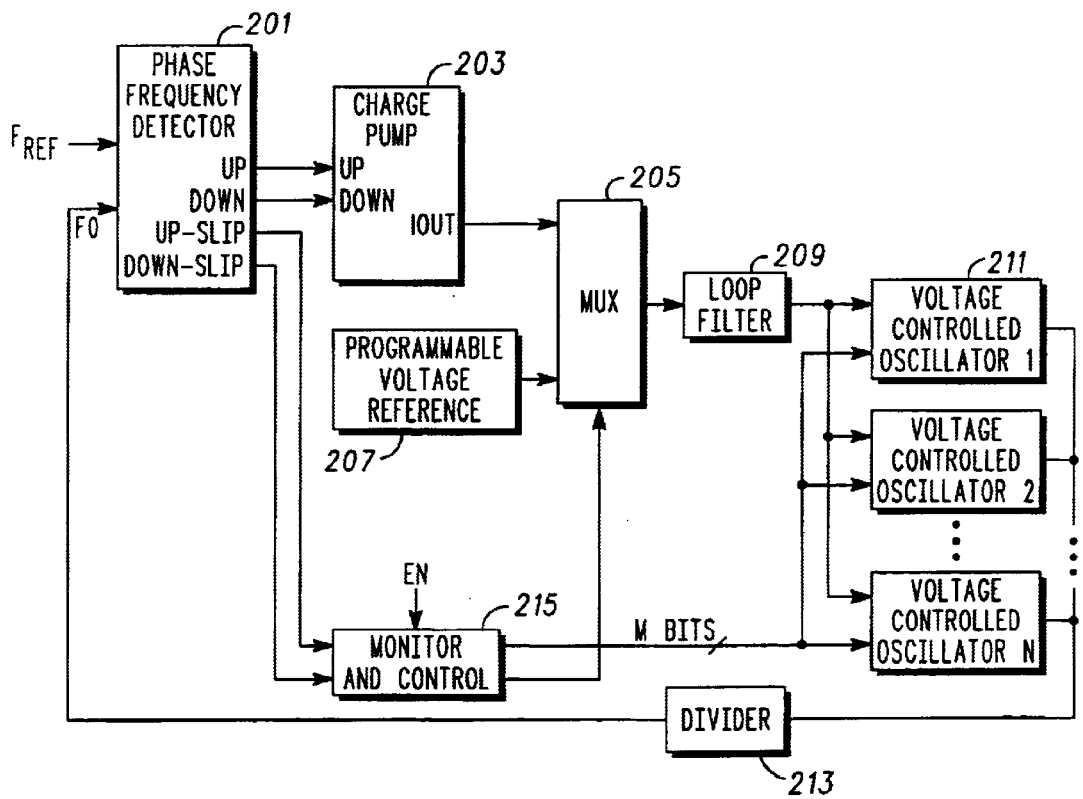
FIG. 2 illustrates a block diagram of a phase locked loop (PLL) synthesizer using a phase frequency detector (PFD) with $2\pi$ slip detection with monitor and control in accordance with the present invention.

Referring now to FIG. 2, a block diagram illustrating a phase locked loop (PLL) 200 that uses a $2\pi$ slip detection system and method according to the present invention. Generally, the invention includes passing the $2\pi$ radians slip information generated by a phase-frequency detector 201 to the monitor and control 215. Based upon input from the PFD 201, the monitor and control 215 then applies an increasing or decreasing frequency correction to one or more VCOs 211 via a coarse tune digital bus. Since the output of the VCOs 211 are fed directly to the input of the PFD 201, the VCO tuning becomes closer to the proper correction, there are fewer slip corrections. As will be evident to a skilled artisan, the system and methods used by the present invention are in direct contrast to the prior art since the information provided by PFD 201 is used to directly tune the frequency of the VCO 211 rather than through the charge pump 203.

The PLL synthesizer 200 is illustrated as a "charge pump" PLL and includes a phase-frequency detector 201 that uses a frequency reference input ($F_{ref}$) and is used for determining the degree of frequency error is present in the PLL. Although shown as a charge pump PLL it will be recognized by those skilled in the art that the present invention might apply to other types of PLL circuits as well. A charge pump 203 is controlled by the PFD 201 where 'UP' frequency or "DOWN" frequency pulses are used to apply a charge to loop filter 209 in the direction that PFD 201 had instructed it to move. If the PFD 201 indicates to the charge pump 203 to move up on frequency then a voltage charge to sent to the loop filter to make an incremental increase in frequency. Conversely, if the PFD 201 indices to move down in frequency then the charge pump provides the appropriate charge to the loop filter 209 to make that incremental decrease in frequency.

In the present invention, a multiplexer (MUX) 205 is positioned between the charge pump 203 and the loop filter 209. The MUX 205 performs at least two critical functions during the operation of the system and method of the present invention. First, the MUX 205 works to break the PLL 200 continuity during the coarse tune condition by disconnecting the charge pump 203 from the loop filter 209. Thus, the present invention is capable of operating in an "open loop" state which gives a tuning speed advantage over prior art techniques. Secondly, the MUX 205 works to select a bias point that can be used as a reference for the VCO 211 free running frequency. It should be evident to those skilled in the art that the VCO 211 may represent one or more VCOs ($VCO_n$). The programmable voltage reference 207 is used to program the MUX 205 to adjust the free running frequency of the VCO 211 so that in a "closed loop" state, the final VCO control voltage input is near the voltage of the programmable voltage reference 207. This is an important feature of the present invention in that it helps to enhance the overall operational range of the VCO 211. The user can then select the optimal range of the VCO by programming the value in the programmable voltage source 207.

After the coarse tune mode is completed the charge pump 203 is connected through-the MUX 205 to the loop filer 209 to resume closed loop PLL operation. The charge pulses applied to the loop filter 209 are then smoothed by the loop filter to eliminate noise and stability problems at the VCO 211. As with any voltage controlled oscillator, the smoothed voltage input is applied to the VCO 211 and it oscillates at some predetermined frequency output. Hence, it will be evident to those skilled in the art that the fine frequency adjustment to the VCO is accomplished when the loop is in a closed state.

The output of the VCO 211 is supplied to a divider 213 to divide down or lower the VCO output frequency. As will be recognized, the divider may be either an integer or fractional divider. This allows the VCO 211 to operate at some predetermined frequency other than that of the reference frequency ($F_{ref}$). This permits the lower VCO output frequency to be compared to the reference frequency by PFD 201. Since the function of the PFD 201 is to attempt to match these frequencies it generates both "UP-SLIP" and "DOWN-SLIP" pulses to an error accumulation in the monitor and control 215 in an attempt to match PFD 201 VCO input frequency ($F_0$) to the reference frequency ($F_{ref}$). When $F_{operating}$ and $F_{ref}$ are more then 360 degrees i.e. $2\pi$ offset in phase, the UP-SLIP and DOWN-SLIP pulses are processed the monitor and control 215. This is referred to as $2\pi$ slip detection. The monitor and control 215 includes a timer (not shown), error accumulator (not shown), and controller (not shown). The monitor and control 215 provides a signal to the MUX 205 to change the PLL to an "open loop" state while the PLL is in coarse tune mode. The UP-SLIPs and DOWN-SLIPs are tracked by the error accumulator in the monitor and control 215. Thus, it is a novel aspect of the present invention for providing a coarse tuning port at the VCO 211 that allows the monitor and control 215 to coarsely alter the VCOs free running frequency. As shown in FIG. 2, a wire bus of "m" bits may be used to control the free running frequency of one or more of the VCOs 211 by the coarse tuning method as taught by the present invention.

To summarize, during coarse tune the MUX 205 forces a voltage on the VCO 211 input by removing the charge pump 203 from the PLL and setting a desirable target bias for the VCO free running frequency. The implementation shown herein has the loop filter 209 driven by the same voltage reference that is driving the input to the VCO 211. This tends to minimize transients and settling time when the PLL 200 switches from a coarse tune mode to the fine tuning or normal close loop tracking mode.

The output of the VCO 211 is compared to the reference frequency ($F_{ref}$) after any required frequency division. The UP and DOWN pulses from the PFD 201 that operate the charge pump 203 are ignored during coarse tune due to the MUX 205 which opens the PLL. However, the $2\pi$ slip pulses can be used to increase or decrease an error accumulation to adjust the VCO 211 free running frequency close to a desired target frequency. The $2\pi$ slip pulses occur at a rate approximately equal to: $1/(F_{ref}-F_{operating})$. When the frequency of $F_{operating}$ is below $F_{ref}$, the slip pulses only occur on the UP-SLIP output of PFD 201. When the frequency $F_0$ is above that of $F_{ref}$, the pulses only occur on the DOWN-SLIP output of PFD 201. Thus, the direction of the required frequency adjustment is easily known and can be used to direct the tuning of the VCO 211.

Figure 3:
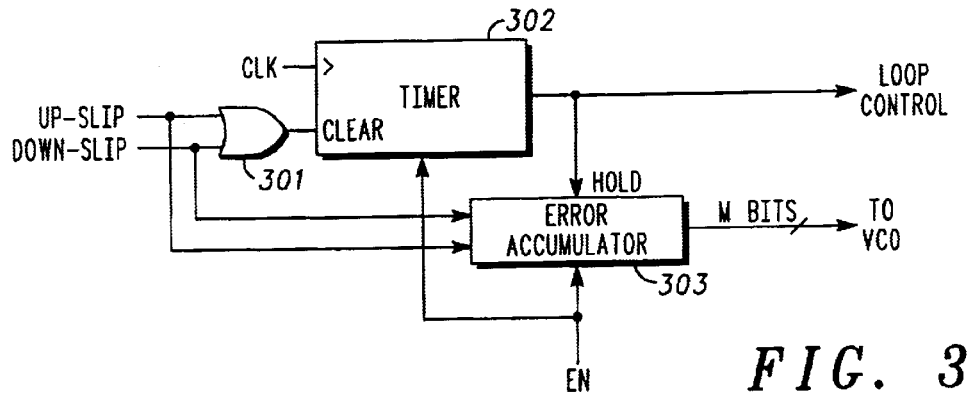
FIG. 3 illustrates the preferred embodiment of the monitor and control circuit operating using $2\pi$ radians frequency slips for adjusting VCO range.

As will be recognized by those skilled in the art, the monitor and control 215 may be implemented in several ways. As best seen in FIG. 3, the preferred embodiment uses a timer 302 to control the times upon which the error accumulator 303 will start and stop its counting sequence. Alternate methods include monitoring the time between $2\pi$ slips and starting and stopping the timer based upon this time. In addition, the error accumulator 303 may be stopped by sensing a change in tuned frequency polarity. The system and tuning method of the present invention is very flexible in this regard and in some systems it may be desirable to track coarse tune updates while the PLL 200 is closed for monitoring purposes. Since the $2\pi$ slips occur at a rate approximately equal to $1/(f_{ref}-f_0)$, the time between slip pulses will be longer the closer the divided VCO output from divider 213 is in relation to the reference frequency. This feature can be exploited to automatically terminate the tune sequence once it gets within a desired frequency range by measuring the time between $2\pi$ slip pulses.

Thus, FIG. 3 also illustrates an example of the method for implementing the monitor and control 215 so as the coarse tune can be stopped after the VCO 211 is tuned within a specified and/or predetermined frequency range. The UP-SLIP and DOWN-SLIP pulses from PFD 201 work as inputs to an error accumulator 303 that processes the $2\pi$ slip information. The error accumulator will perform a simple linear count, enforce a non-linear count or any custom tune sequence to "m" bits that alter the VCO 211 free running frequency. The UP-SLIP and DOWN-SLIP pulses from PFD 201 (FIG. 2) are also inputs to the OR gate 301. The OR gate 301 generates a signal output at the occurrence of any $2\pi$ slip and triggers timer 302 to clear and restart the timing sequence. If the amount of time between $2\pi$ slips is long enough for timer 302 to timeout, an output signal is sent to an input of the error accumulator 303 to hold the current tune condition being sent to VCO 211. This same output signal from timer 302 is sent to MUX 205 as loop control to close the PLL loop to allow fine tuning to proceed under closed loop conditions.

Figure 4:
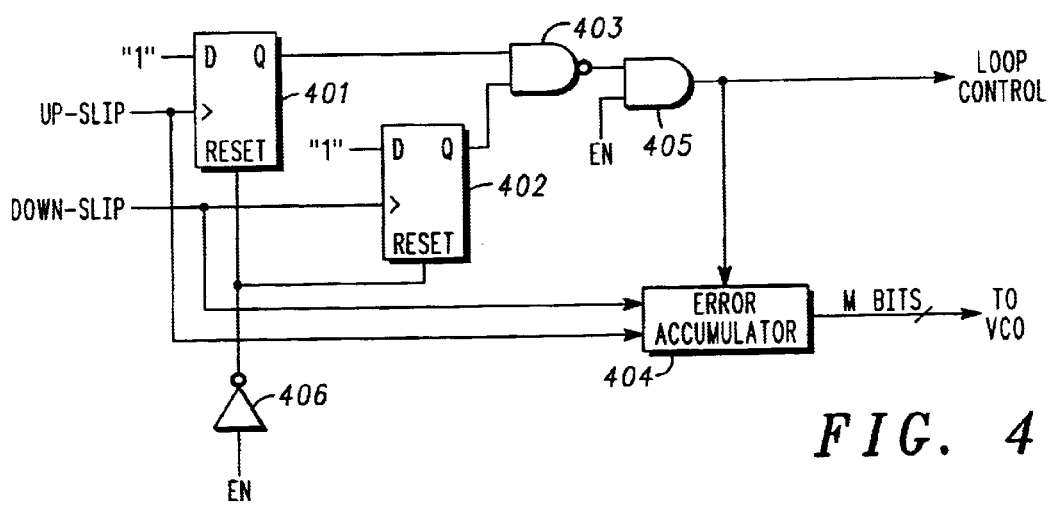
FIG. 4 and FIG. 5 illustrate alternative embodiments of the monitor and control circuit shown in FIG. 2.

FIG. 4 illustrates an alternative embodiment of the monitor and control 215 that can be implemented with the present invention. In this embodiment a coarse tune stop is used after the polarity of the tune frequency corrections first changes direction. An enable signal "en" is input to a logical inverter 406 that holds the digital flip-flop circuits 401 and 402 in a reset state. When tuning begins, the enable signal "en" changes state so that the reset condition on flip-flops 401 and 402 are no longer enforced. The UP-SLIP and DOWN-SLIP pulses from PFD 201 are input to an error accumulator 404 that processes the $2\pi$ slip information. The error accumulator then performs a simple linear count, a non-linear count or any custom tune sequence to the "m" bits that alter the VCO 211 free running frequency. The UP-SLIP pulses from PFD 201 are also input to the digital flip-flop circuit 401. This flip-flop circuit 401 is connected in such a way that the UP-SLIP pulses pass an enabling signal through the flip-flop changing it from the reset state into a set state.

Similarly, the DOWN-SLIP pulses from PFD 201 work also an input to a second digital flip-flop circuit 402. This flip-flop circuit 402 is connected in such a way that the UP-SLIP pulses pass an enabling signal through the flip-flop changing it from the reset state into a set state. The output of flip-flop 401 is input to NAND gate 403 while the output of flip-flop 403 is input to a second input of NAND gate 403. When both flip-flops 401 and 402 are in the set state the output of NAND gate 403 changes state. The output of NAND gate 403 is an input to AND gate 405 while AND gate 405 will pass the state of the output of NAND gate 403 to the output of AND gate 405 if the enable signal "en" on a second input to AND gate 405 is in an enabling state. The output of AND gate 405 is then sent to the error accumulator 404 to hold the current tune condition being sent to VCO 211. This same output signal from AND gate 405 is sent to MUX 205 as loop control to close the PLL loop to allow fine tuning to proceed under closed loop conditions.

Figure 5:
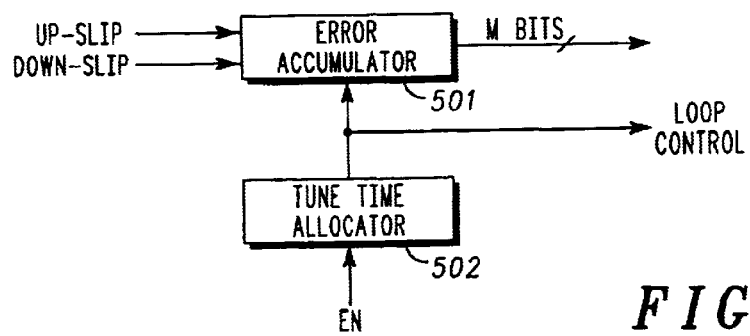

FIG. 5 is yet another embodiment of the monitor and control 215 that may be implemented to allow the coarse tune to be stopped after a fixed time interval. The UP-SLIP and DOWN SLIP pulses from PHD 201 are inputs to an error accumulator 501 that processes the $2\pi$ slip information. The error accumulator then works to either perform a simple linear count, enforce a non-linear count or any custom tune sequence to the m bits that alter the VCO 211 free running frequency. An enable signal "en" is input to the tune time allocator 502 that establishes the amount of time allocated for tuning to occur. The tune time allocator output is sent to MUX 205 as loop control to open the PLL loop to allow the coarse tuning sequence to begin. Once the allocated tuning time expires, the tune time allocator output is sent to MUX 205 as loop control to close the PLL loop to allow fine tuning to proceed under closed loop conditions.

As will be recognized by those of ordinary skill, the system and method of the present invention offers a distinct advantage in that the $2\pi$ slips occur at a rate proportional to the frequency difference that can be used to constrain the coarse tune any number of ways. This greatly enhances the ability of a PLL synthesizer to avoid the circuit and environment anomalies of the prior art to permit the VCO to be quickly tuned maintaining it within its predetermined operating range.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A system for coarsely tuning at least one voltage controlled oscillator (VCO) in a phase locked loop (PLL) synthesizer comprising:
    a phase-frequency detector (PFD) for determining a phase difference between a VCO frequency and a reference frequency and providing an error signal if the VCO frequency and reference frequency are at least $2\pi$ radians out of phase;
    a monitor for tracking the number of error signals produced by the PFD; and
    wherein the free running frequency of the VCO may be coarsely tuned in the event the monitor circuit reaches some predetermined level.

2. A system for coarsely tuning at least one VCO as in claim 1, further comprising:
    at least one multiplexer (MUX) controlled by the monitor for changing the PLL to an open loop state.

3. A system for coarsely tuning at least one VCO as in claim 2, further comprising:
    a programmable voltage source connected to the MUX for adjusting the free running frequency of the at least one VCO when operating in a closed loop state.

4. A system for coarsely tuning at least one VCO as in claim 1, wherein the VCO includes a programmable coarse tune control for overlapping the at least one VCO tuning range.

5. A system for coarsely tuning at least one VCO as in claim 4, wherein the programmable coarse tune control is non-monotonic for a plurality of settings.

6. A system for coarsely tuning at least one VCO as in claim 1, wherein the monitor includes a timer, error accumulator, and controller.

7. A PLL synthesizer as in claim 1, wherein the at least one monitor includes a timer, error accumulator, and controller.

8. A phase locked loop (PLL) synthesizer including a system for coarsely tuning at least one voltage controlled oscillator (VCO) based upon a phase difference between the VCO free running frequency and a predetermined reference frequency comprising:
    a phase-frequency detector (PFD) for detecting the phase difference between the VCO and the reference frequency and providing a correction signal when the difference between the VCO free running frequency and the reference frequency is at least 360 degrees out of phase;
    at least one controller for monitoring the number of correction signals produced by the PFD;
    a multiplexer (MUX) for directing the PLL into either an open loop state and close loop state; and
    wherein the at least one controller controls the MUX to change the PLL into an open loop state and coarsely tunes the free running frequency of the at least one VCO when a correction signal count at the at least one controller reaches a predetermined level.

9. A PLL synthesizer as in claim 8, further comprising:
    a charge pump for providing a charge pulse to a loop filter for controlling the fine tuning of the free running frequency of the PLL synthesizer.

10. A PLL synthesizer as in claim 8, wherein the PLL synthesizer is fine tuned in a closed loop mode.

11. A PLL synthesizer as in claim 8, wherein a programmable voltage reference connected to the MUX controls the free running operating frequency of the at least one VCO.

12. A PLL synthesizer as in claim 8, wherein the at least one VCO includes a programmable coarse tune control for overlapping the at least one VCO tuning range.

13. A PLL synthesizer as in claim 8, wherein the programmable coarse tune control is non-monotonic for a plurality of settings.

14. A method for coarse tuning in a coarse tune mode at least one voltage controlled oscillator (VCO) in a phase locked loop (PLL) synthesizer comprising:
    measuring the phase difference between the operating frequency of the at least one VCO and a predetermined reference frequency;
    providing a error correction signal in response to a phase difference greater then $2\pi$ radians;
    monitoring the number error signals produced using at least one controller;
    opening the PLL synthesizer in response to the number of error signals that reach a predetermined number; and
    coarsely tuning the VCO in order to substantially match the operating frequency of the VCO to the reference frequency.

15. A method for coarse tuning at least one VCO as in claim 14, wherein the PLL is opened using a multiplexer (MUX).

16. A method for coarse tuning at least one VCO as in claim 14, further including the step of:
    closing the PLL after coarsely tuning so that the PLL may enter a fine tune mode.

17. A method for coarsely tuning at least one VCO as in claim 14, wherein the PLL is finely tuned using a charge pump and loop filter.

18. A method for coarse tuning at least one VCO as in claim 14, further including the step of:
    using a programmable coarse tune control for overlapping the at least one VCO tuning range.

19. A method for coarsely tuning at least one VCO as in claim 14, wherein the programmable coarse tune control is non-monotonic for a plurality of settings.

20. A system for coarsely tuning at least one VCO as in claim 14, wherein the at least one controller includes a timer, error accumulator, and controller.

* * * * *